(12) United States Patent
Reiner et al.

(10) Patent No.: US 9,515,162 B2
(45) Date of Patent: Dec. 6, 2016

(54) SURFACE TREATMENT OF SEMICONDUCTOR SUBSTRATE USING FREE RADICAL STATE FLUORINE PARTICLES

(71) Applicant: Infineon Technologies Austria AG, Villach (AT)

(72) Inventors: Maria Reiner, Villach (AT); Clemens Ostermaier, Villach (AT); Peter Lagger, Rothenthurn (AT); Gerhard Prechtl, Rosegg (AT); Oliver Haeberlen, Villach (AT); Josef Schellander, Villach (AT); Guenter Denifl, Annenheim (AT); Michael Stadtmueller, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/637,610

(22) Filed: Mar. 4, 2015

(65) Prior Publication Data

US 2016/0260817 A1    Sep. 8, 2016

(51) Int. Cl.
  *H01L 21/338* (2006.01)
  *H01L 29/66* (2006.01)
  *H01L 21/223* (2006.01)

(52) U.S. Cl.
  CPC ..... *H01L 29/66462* (2013.01); *H01L 21/2233* (2013.01); *H01L 21/2236* (2013.01); *H01L 29/66522* (2013.01)

(58) Field of Classification Search
  CPC .................. H01L 29/66462; H01L 21/2233; H01L 21/2236; H01L 29/66522
  USPC ......................................................... 438/172
  See application file for complete search history.

(56) References Cited

U.S. PATENT DOCUMENTS

| | | | |
|---|---|---|---|
| 6,452,315 B1 * | 9/2002 | Vane | H01J 37/32082 313/231.31 |
| 6,880,561 B2 | 4/2005 | Goto et al. | |
| 8,318,605 B2 * | 11/2012 | Kao | H01L 21/02063 438/719 |
| 2013/0105808 A1 * | 5/2013 | Wong | H01L 29/517 257/76 |

OTHER PUBLICATIONS

Grasser, T., "Stochastic Charge Trapping in Oxides: From Random Telegraph Noise to Bias Temperature Instabilities", Microelectronics Reliability, vol. 52, Issue 1, 2012, pp. 39-70.

(Continued)

*Primary Examiner* — Tod T Van Roy
*Assistant Examiner* — Vu A Vu
(74) *Attorney, Agent, or Firm* — Murphy, Bilak & Homiller, PLLC

(57) ABSTRACT

A substrate having a buffer layer and a barrier layer is formed. The buffer and barrier layers have different bandgaps such that an electrically conductive channel comprising a two-dimensional charge carrier gas arises at an interface between the buffer and barrier layers due to piezoelectric effects. The substrate is placed in a fluorine containing gas mixture that includes free radical state fluorine particles and is substantially devoid of ionic state fluorine particles. A first lateral surface section of the substrate is exposed to the gas mixture such that the free radical state fluorine particles contact the first lateral surface section without penetrating the substrate. A semiconductor device that incorporates first lateral surface section in the structure of the device is formed in the substrate.

14 Claims, 20 Drawing Sheets

(56) References Cited

OTHER PUBLICATIONS

Guhel, Y. et al., "Impact of Plasma Pre-Treatment before SiNx Passivation on AlGan/GaN HFETs Electrical Traps", Solid-State Electronics, vol. 49, 2005, pp. 1589-1594.

Huang, S. et al., "Effects of the Flourine Plasma Treatment on the Surface Potential and Schottky Barrier Height of $Al_x Ga_{1-x} N$/GaN Heterostructures", Applied Physics Letters, vol. 96, 2010, 4 pages.

Ibbetson, J. P. et al., "Polarization Effects, Surface States, and the Source of Electrons In AlGaN/GaN Hetrostructure Field Effect Transistors", Applied Physics Letters, vol. 77, 2000, 4 pages.

Lagger, P. et al., "Comprehensive Study of the Complex Dynamics of Forward Bias-Induced Threshold Voltage Drifts in GaN Based MIS-HEMTs by Stress/Recovery Experiments", IEEE Transaction on Electron Devices, vol. 61, No. 4, Apr. 2014, pp. 1022-1030.

Lagger, P. et al., "Role of the Dielectric for the Charging Dynamics of the Dielectric/Barrier Interface in AlGaN/GaN based Metal-Insulator-Semicconductor Structures under Forward Gate Bias Stress", Applied Physics Letters, vol. 105, 2014, 6 pages.

Lagger, P. et al., "Very Fast Dynamics of Threshold Voltage Drifts in GaN-Based MIS-HEMTs", IEEE Electron Device Letters, vol. 34, No. 9, Sep. 2013, pp. 1112-1114

Vanko, G. et al., "Impact of SF6 Plasma on DC and Microwave Performance of AlGaN/GaN HEMT Structures", The Seventh International Conference on Advanced Semiconductor Devices and Microsystems (ASDAM 2008), Smolenice Castel, Slovakia, Oct. 12-16, 2008, pp. 335-338.

Zhang, Y. et al., "High Threshold Voltage in GaN MOS-HEMTs Modulated by Flourine Plasma and Gate Oxide", 71st Annual Device Research Conference, Notre Dame, IN, USA, Jun. 23-26, 2013, pp. 141-142.

\* cited by examiner

13A

13B

*18A*

18B

SURFACE TREATMENT OF SEMICONDUCTOR SUBSTRATE USING FREE RADICAL STATE FLUORINE PARTICLES

TECHNICAL FIELD

The instant application relates to semiconductor processing techniques, and more particularly relates to fluorine treatment processes that influence the threshold voltage and dynamic behavior of a semiconductor device.

BACKGROUND

Semiconductor transistors, in particular field-effect controlled switching devices such as a MISFET (Metal Insulator Semiconductor Field Effect Transistor), in the following also referred to as MOSFET (Metal Oxide Semiconductor Field Effect Transistor) and a HEMT (high-electron-mobility Field Effect Transistor) also known as heterostructure FET (HFET) and modulation-doped FET (MODFET) are used in a variety of applications. An HEMT is a transistor with a junction between two materials having different band gaps, such as GaN and AlGaN. In a GaN/AlGaN based HEMT, a two-dimensional electron gas (2DEG) arises at the interface between the AlGaN barrier layer and the GaN buffer layer. In an HEMT, the 2DEG forms the channel of the device instead of a doped region, which forms the channel in a conventional MOSFET device. Similar principles may be utilized to select buffer and barrier layers that form a two-dimensional hole gas (2DHG) as the channel of the device. Without further measures to modify the intrinsic, self-conducting state of the channel, the HEMT device is a normally-on transistor. That is, measures must be taken to prevent the channel region of an HEMT from being in a conductive state in the absence of a positive gate voltage.

Due to the high electron mobility of the two-dimensional carrier gas in the heterojunction configuration, HEMTs offer high conduction and low losses in comparison to many conventional semiconductor transistor configurations. The advantageous conduction characteristics make HEMTs desirable in applications, including, but not limited to use as switches in power supplies and power converters, electric cars, air-conditioners, and in consumer electronics, for example. However, normally-on HEMTs have limited applicability in these applications because these devices must be accompanied by circuitry that can generate the negative voltages necessary to turn the device off. Such circuitry adds cost and complexity to the design. For this reason, it is typically desirable to include features in an HEMT that modify the intrinsic normally-on configuration and provide a normally-off device.

Several designs and corresponding processing techniques have been developed to alter the normally-on aspect of HEMT devices and provide a normally-off device. For example, HEMTs may have a J-FET type structure with a p-type doped gate junction that achieves a threshold voltage (Vth) >0. However, these devices have the disadvantage of limited overdrive capability, due to the opening of the pn-heterojunction. Alternatively, an HEMT having a threshold voltage (Vth) >0 may be achieved by a variety of different MISFET designs with doping in the dielectric insulator between the channel and the gate electrode. However, these MISFET devices suffer from the drawback that the dielectric interface between the gate insulator and the substrate can be unstable. This instability causes significant drifting of the threshold voltage (Vth) drift of the device. That is, the threshold voltage (Vth) of the device changes as the device is biased (either constant or varying) over time. Although trapping behavior is known to contribute to this phenomenon, it has been shown that over the lifetime of a GaN based MISFET structure, the threshold voltage (Vth) drift of the device is not limited by the amount of charge traps, and can theoretically converge with an overdrive bias over a long period of time.

FIGS. 1-3 show the threshold voltage (Vth) drifting behavior of a device, as described by Lagger, et al. in *Comprehensive Study of the Complex Dynamics of Forward Bias-Induced Threshold Voltage Drifts in GaN Based MIS-HEMTs by Stress/Recovery Experiments*, Electron Devices, IEEE Transactions. vol. 61, no. 4, pp. 1022, 1030, April 2014. The device represented in these figures is a normally-on MISFET formed from 28 nm thick AlGaN/GaN substrate with 25% aluminum content and a 30 nm thick $SiO_2$ passivation layer. Referring to FIG. 1, the change in threshold voltage ($\Delta$Vth) is plotted as a function of recovery time for a fixed stress bias (4V) and varying stress time. The stress time is varied between 100 ns, 1 µs . . . to 10 s. Referring to FIG. 2, the change in threshold voltage ($\Delta$Vth) is plotted as a function of stress time for a certain recovery time (100 µs) is depicted. The stress bias is varied between 1, 2 . . . to 7V. Referring to FIG. 3, the change in threshold voltage ($\Delta$Vth) is plotted as a function of stress bias for a certain time. The stress time is varied between 100 ns, 1 µs . . . to 10 s. The time constants related to this data cannot be directly linked to Schottky-Read-Hall (SRH) behaving defect states described by simple energy levels and cross sections. All known MIS (or MOS) interfaces devices today follow this behavior, and it is particularly pronounced in heterojunction devices.

It is therefore desirable to produce an HEMT that is less susceptible to threshold voltage drifting as described above.

SUMMARY

A method of forming a III-V semiconductor device is disclosed. According an embodiment, the method includes forming a substrate having a buffer layer and a barrier layer adjoining and extending along the buffer layer. The buffer layer and barrier layers are formed from first and second semiconductor materials having different band-gaps such that an electrically conductive channel including a two-dimensional charge carrier gas arises at an interface between the buffer and barrier layers due to piezoelectric effects. A fluorine treatment is applied to the substrate. The fluorine treatment includes placing the substrate in a fluorine containing gas mixture. The fluorine containing gas mixture includes free radical state fluorine particles and is substantially devoid of ionic state fluorine particles. A first lateral surface section of the substrate is exposed to the fluorine containing gas mixture such that the free radical state fluorine particles contact the first lateral surface section without penetrating the substrate. A semiconductor device that incorporates the first lateral surface section into the structure of the semiconductor device is formed in the substrate.

A method of forming a semiconductor device is disclosed. According to an embodiment, the method includes forming a substrate having a buffer layer and a barrier layer adjoining and extending along the buffer layer. The buffer layer and barrier layers are formed from first and second semiconductor materials having different band-gaps such that an electrically conductive channel comprising a two-dimensional charge carrier gas arises at an interface between the buffer and barrier layers due to piezoelectric effects. A fluorine treatment is applied to the substrate. The fluorine treatment includes exposing a first lateral section of the substrate to a fluorine containing gas mixture so as to influence dominant surface donors at the first lateral section of the substrate and shift a dynamic response of the two-dimensional charge carrier gas under biasing. The fluorine containing gas mixture is substantially devoid of ionic state fluorine particles and includes free radical state fluorine particles. A semiconductor device that incorporates the first lateral surface section into the structure of the semiconductor device is formed in the substrate.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 13A and 13B, illustrates short term behavior of a fluorine treated MISFET device with the measurement setup of FIG. 12 is applied to the device, according to an embodiment.

FIGS. 14A and 14B, illustrates a model of donor surface states contributing to the conduction of the 2DEG in a MISFET HEMT device.

FIGS. 18A and 18B, illustrates the dynamic behavior of fluorine treated devices of varying barrier layer composition.

DETAILED DESCRIPTION

Embodiments of a method described herein include the application of a fluorine treatment process to a semiconductor substrate prior to gate dielectric formation. The semiconductor substrate may include a heterojunction with a two-dimensional charge carrier gas arising near the heterojunction. The heterojunction can be used to form a channel of a semiconductor device, such as a HEMT, with a gate electrode and gate dielectric formed directly over the portion of the substrate that has been subjected to the fluorine treatment process. That is, the fluorine treatment process can be used to treat a dielectric interface region that is between the gate dielectric and the subjacent semiconductor material.

The fluorine treatment process described herein differs from conventional fluorine based cleaning or implantation techniques in regards to the amount of fluorine ions that are exposed to the surface of the substrate. Conventional fluorine based cleaning or implantation techniques rely on the application of fluorine ions to an exposed surface to modify (e.g., remove) portions of the surface and/or penetrate the substrate with ions. By contrast, the fluorine treatment process described is controlled to minimize the amount of electrically charged fluorine ions that are exposed to the substrate and to maximize the amount of electrically neutral fluorine free radicals that are exposed to the substrate. Consequently, the fluorine particles in the fluorine treatment process described herein do not etch or penetrate the surface of the substrate. Further, the fluorine treatment process described herein does not modify the roughness and morphology of the surface of the substrate, as seen by AFM (atomic force microscopy) images.

The inventors have found that applying a fluorine treatment technique in this manner, that is, to treat the dielectric interface with a fluorine mixture with a maximum amount of free radical state fluorine particles and minimum amount of ionic state fluorine particles, enhances the performance of the device. More particularly, the threshold voltage drifting effect as described with reference to FIG. 1-3 can be substantially abrogated, if not completely eliminated.

Figure 4:
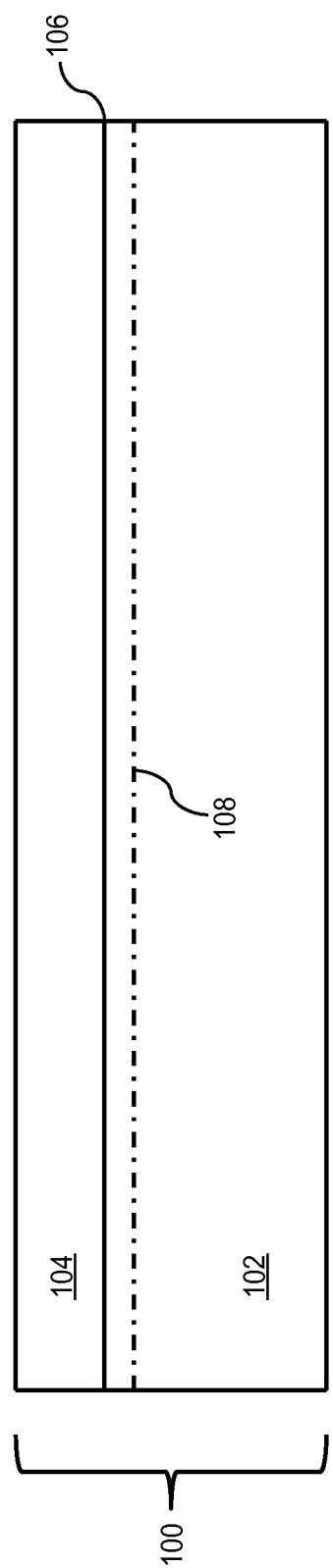
FIG. 4 illustrates a heterojunction substrate having a barrier layer and a buffer layer, according to an embodiment.

Referring to FIG. 4, a substrate 100 is depicted. The substrate 100 includes a buffer layer 102 and a barrier layer 104. The barrier layer 104 directly adjoins the buffer layer 102 at an interface 106 between the two layers 102, 104. Further, the barrier layer 104 extends along the buffer layer 102 in a lateral direction and therefore covers at least a portion of the buffer layer 102. The buffer and barrier layers 102, 104 are formed from first and second semiconductor materials having different band-gaps. This difference in band-gaps causes a two-dimensional charge carrier gas to arise at the interface 106 between the buffer and barrier layers 102, 104, due to piezoelectric effects. That is, the substrate 100 is configured with a heterojunction. For example, GaN may be combined with AlGaN or InAlN to form an electron gas inversion region.

According to an embodiment, the buffer layer 102 is formed from GaN and the barrier layer 104 is formed from AlGaN. Specifically with regard to GaN technology, the presence of polarization charges and strain effects in a GaN-based heterostructure body due to piezoelectric effects yield a two-dimensional charge carrier gas in the heterostructure body characterized by very high carrier density and carrier mobility. This two-dimensional charge carrier gas, such as a 2DEG (two-dimensional electron gas) or 2DHG (two-dimensional hole gas), forms a conductive channel 108 that may be used in an HEMT near the interface between, e.g., a GaN alloy barrier region and a GaN buffer region. A thin, e.g. 1-2 nm, AlN layer can be provided between the GaN buffer region and the GaN alloy barrier region to minimize alloy scattering and enhance 2DEG mobility. In a broad sense, the heterojunction substrate 100 described herein can be formed from any binary, ternary or quaternary III-nitride compound semiconductor material where piezoelectric effects are responsible for the device concept.

Figure 5:
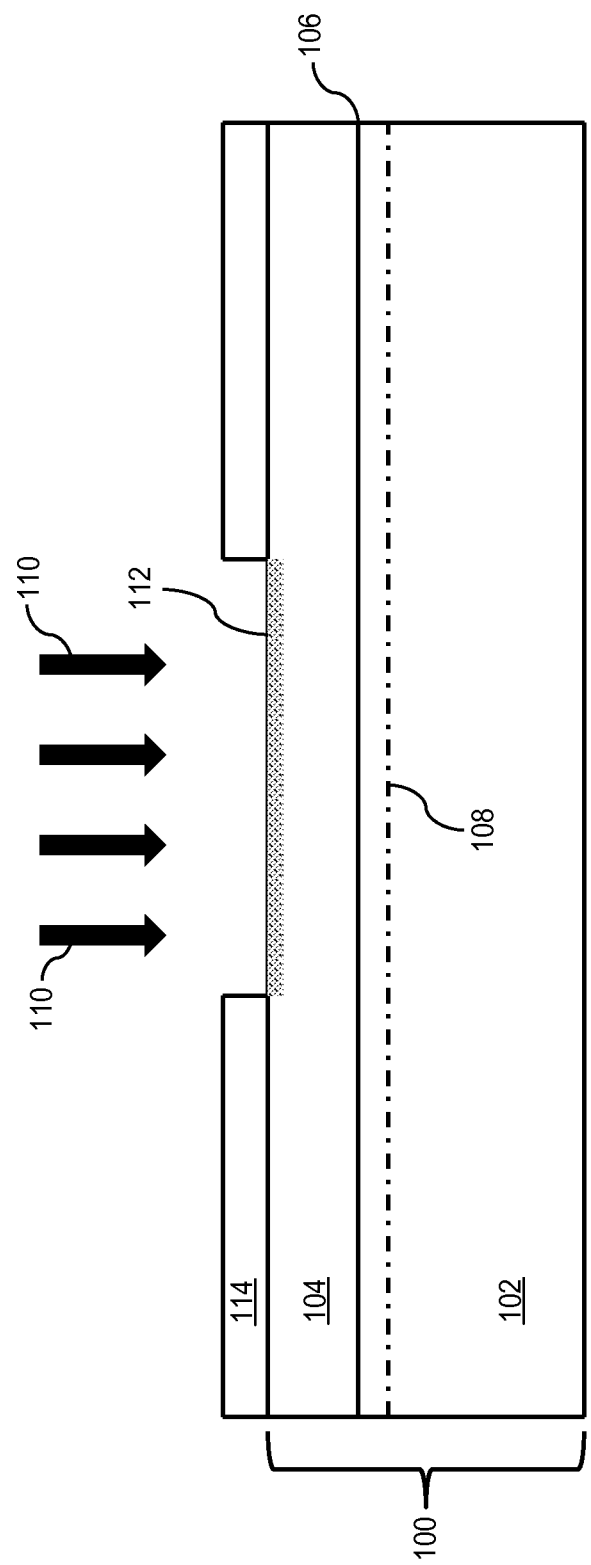
FIG. 5 illustrates a fluorine treatment process applied to a first lateral surface section of the substrate, according to an embodiment.

Referring to FIG. 5, a fluorine treatment is applied to a portion of the substrate 100. According to this technique, the substrate 100 is placed in a fluorine containing gas mixture 110. At least one surface section 112 of the substrate 100 is directly exposed to the fluorine containing gas mixture 110 such that particles of the fluorine containing gas mixture 110 contact the exposed surface section 112. As used herein, a "particle" refers to an atom or molecule that forms the smallest amount of a particular substance having the characteristics of that substance. For example, the particles in Tetrafluormethan ($CF_4$) gas are individual molecules of $CF_4$. Further, as used herein, a "fluorine containing gas mixture" refers to a gas with at least some of the particles being fluorine atoms or molecules with fluorine as a constituent component.

In the embodiment of FIG. 5, a masking process has been applied to the substrate 100 prior to the fluorine treatment such that only a portion of the substrate 100 is exposed to the fluorine containing gas mixture 110. More particularly, the barrier layer 104 is partially covered by a mask 114 with a lateral section 112 of the barrier layer 104 being exposed from the mask 114. According to an embodiment, only the lateral section 112 of the barrier layer 104 is exposed and the rest of the substrate 100 is covered by the mask 114. The mask 114 may be an oxide that is formed according to conventionally known techniques, for example. The masking process is optional. According to another embodiment, the masking process is skipped such that the fluorine treatment is applied to a complete surface of the substrate 100, e.g., the entire surface of the barrier layer 104. According to yet another embodiment, the substrate 100 may be provided with a passivation layer that acts as a mask and exposes the lateral section 112 of the barrier layer 104 during fluorine treatment. This passivation layer can be integrated into the finalized device.

The fluorine containing gas mixture 110 includes free radical state fluorine particles and is substantially devoid of ionic state fluorine particles. Free radical state particles are those particles having unpaired electrons. That is, free radical state fluorine particles have an odd number of electrons. The fluorine atoms may be a constituent component of any of a variety of molecules. By contrast, ionic state fluorine particles are particles having a net charge. That is, ionic state fluorine particles have a different number of electrons than protons. Therefore, the free radical state fluorine particles that the substrate 100 is exposed to have fluorine as a constituent component, and have an odd number of electrons, but are electrically neutral.

Because, the fluorine containing gas mixture 110 is substantially devoid of ionic state fluorine particles, the fluorine treatment process described herein exposes the substrate 100 to fluorine particles without ionization effects occurring at the surface of the substrate 100. Consequently, during the fluorine treatment, the fluorine particles contact and influence dominant surface donors at the surface of the substrate 100 so as to shift a dynamic response of the two-dimensional charge carrier gas 108 under biasing (in a manner to be described in further detail below). Further, this is done without driving any fluorine ions beneath a surface of the substrate. The fluorine treated lateral surface section 112 of the barrier layer 104 is represented in the figures with a depth for illustration purposes only, and is intended to highlight a surface section of the substrate 100. Any fluorine particles from the fluorine treatment process (if they remain on the substrate at all) will remain exclusively at the surface of the substrate 100.

Figure 6:
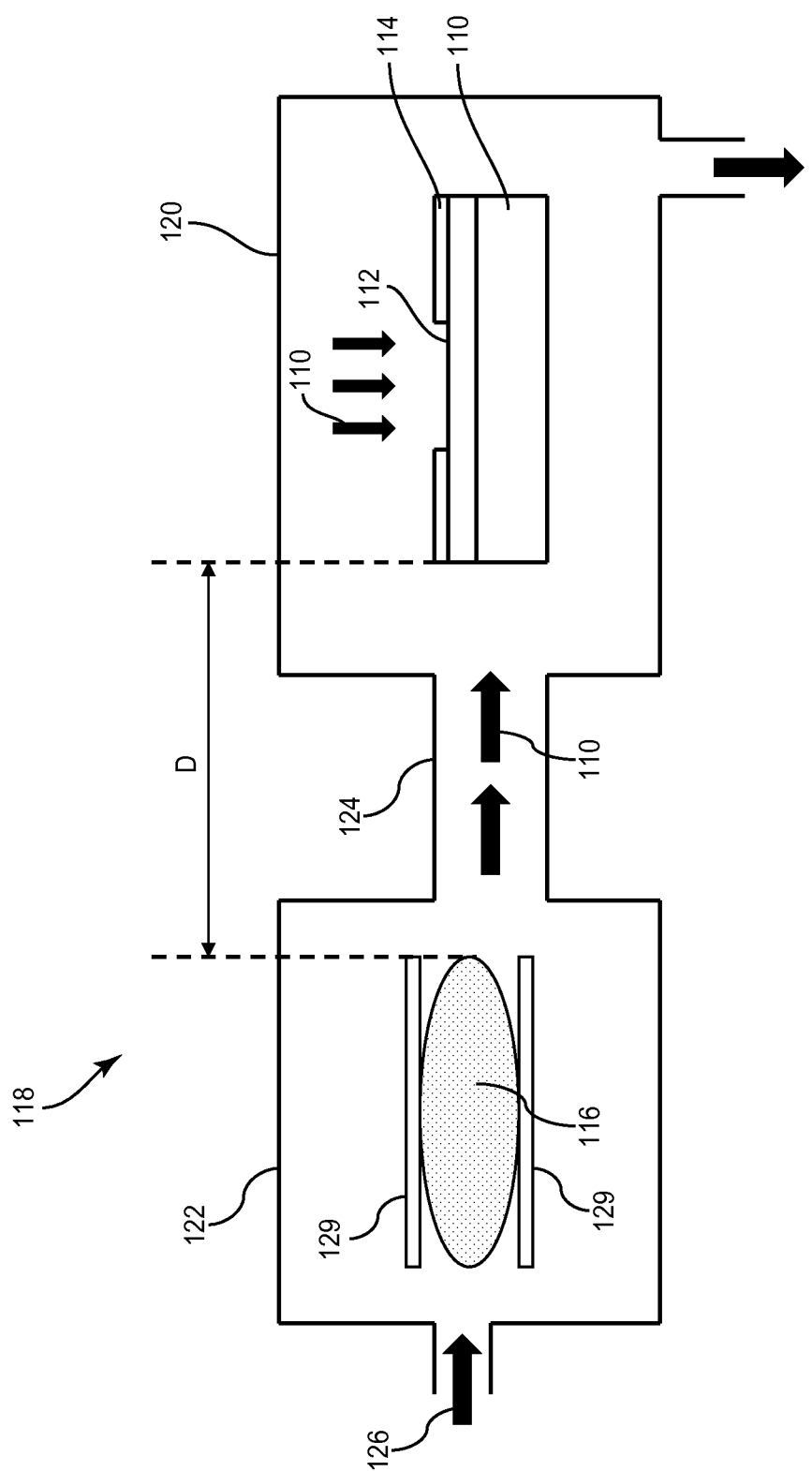
FIG. 6 illustrates a remote plasma process technique that may be used to perform the fluorine treatment process, according to an embodiment.

FIG. 6 depicts a remote plasma process for generating the fluorine containing gas mixture 110 and treating the substrate 100, according to an embodiment. In a remote plasma process, a fluorine plasma 116, i.e., a plasma that at least partially includes fluorine molecules or atoms, is generated distant from the substrate 100 such that the fluorine plasma 116 does not contact the first lateral surface section 112 (i.e., the exposed section of the substrate 100). The separation distance (D) should be sufficiently large to ensure that the substrate 100 is distant from both the plasma 116 and the plasma afterglow, i.e. a decaying plasma region in which ionic state particles of the plasma become de-excited and de-ionized. According to an embodiment, this separation distance (D) between the fluorine plasma 116 and the substrate 100 is at least ten centimeters. Exemplary separation distances (D) are in the range of twenty or thirty centimeters, for example.

In the embodiment depicted in FIG. 6, the remote plasma process includes providing a treatment tool 118 with first and second chambers 120, 122. The first and second chambers 120, 122 are three dimensional enclosures and may be rectangular or cubic shaped. The second chamber is sufficiently large to accommodate the substrate 100.

The first chamber 120 is in open communication with the second chamber 122. That is, the treatment tool 118 includes a conduit 124 extending between the first and second chambers 120, 122 that allows gasses to flow freely between the two. A cross-sectional area of this conduit 124 may be significantly smaller than an area of the respective sidewalls of the first and second chambers 120, 122 adjoining the conduit 124. The substrate 100 is placed in the first chamber 120 with the first lateral surface section 112 being exposed to the ambient atmosphere of the first chamber 120. A fluorine injection gas mixture 126 is introduced into the second chamber 122. The fluorine injection gas mixture 126 may include any one or combination of the following gasses: $CF_4$ (Tetrafluormethan), $C_2F_6$ (Hexafluorethan), $C_3F_8$ (Perfluorpropan), $C_4F_6$ (Perfluorbutadien), $SF_6$, $NF_3$, $XeF_2$, $XeF_4$, $XeF_6$, and $F_2$. Further, the fluorine injection gas mixture 126 may include other non-fluorine containing gasses, such as N2, O2, ambient atmosphere, etc.

According to an embodiment, the fluorine plasma 116 is generated by an RF signal that causes particles in the fluorine injection gas mixture 126 to ionize and transform the fluorine injection gas mixture 126 into a plasma state. This signal may be generated by first and second electrodes 129. In this technique, the substrate 100 does not form either one of the electrodes 129 Thus, ionic state fluorine particles generated by the plasma 116 are not attracted to the substrate 100 and do not contact the substrate 100. However, radical state fluorine particles generated by the plasma 116 are caused to emanate from the second chamber 122 to the first chamber 120 by some force other than electromagnetism. For example, the treatment tool may include a suction mechanism that draws the radical state fluorine particles generated by the plasma 116 towards the first chamber 120 and therefore towards the substrate 100. The parameters of the process are set to maximize the ratio of (non-ionized) radical state fluorine particles in the second chamber 122 in relation to the amount of ionic state fluorine particles in the second chamber 122. Process parameters that influence this ratio include, but are not limited to: the geometry of the first and second chambers 120, 122, and the power and frequency of the signal applied to the first and second electrodes 129.

Figure 7:
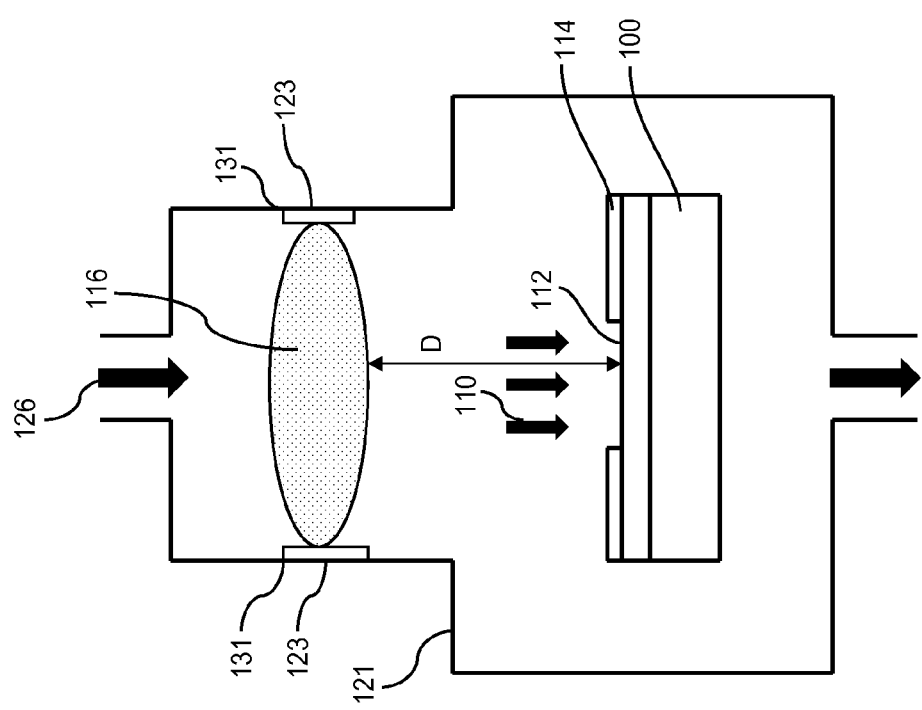
FIG. 7 illustrates a remote plasma process technique that may be used to perform the fluorine treatment process, according to another embodiment.

FIG. 7 depicts a remote plasma process for generating the fluorine containing gas mixture 110 and treating the substrate 100, according to another embodiment. The remote plasma process technique depicted in FIG. 7 differs from the technique in FIG. 6 in that it does not utilize two chambers 120, 122. The treatment tool of FIG. 7 has a single chamber 121. A lower region of the chamber 121 may be rectangular, and is sufficiently large to accommodate the wafer (e.g., 30 cm in diameter). The plasma is generated in an upper region of the chamber 121, which may be cylindrical. A first inductive coil 131 surrounds the upper region of the chamber 121. According to an embodiment, the plasma 116 is generated by applying a 900 W RF signal to the first coil 131. The substrate 100 is shielded from the electric field generated by the coil 131. The treatment tool may further include a faraday shield 123 that is typically at 0V during the plasma generation. Other parameters may be similar or identical to those described with reference to FIG. 6.

In the remote plasma process of FIG. 7, the substrate 100 is separated from the plasma 116 by a sufficient distance to minimize the amount of reactive ions that the substrate 100 is exposed to. That is, the separation of the substrate 100 from the plasma 116 ensures that the substrate 100 is exposed to the fluorine containing gas mixture 110 that is substantially devoid of ionic state fluorine particles, and includes free radical state fluorine particles. According to an embodiment, this separation distance (D) is at least ten centimeters.

Figure 8:
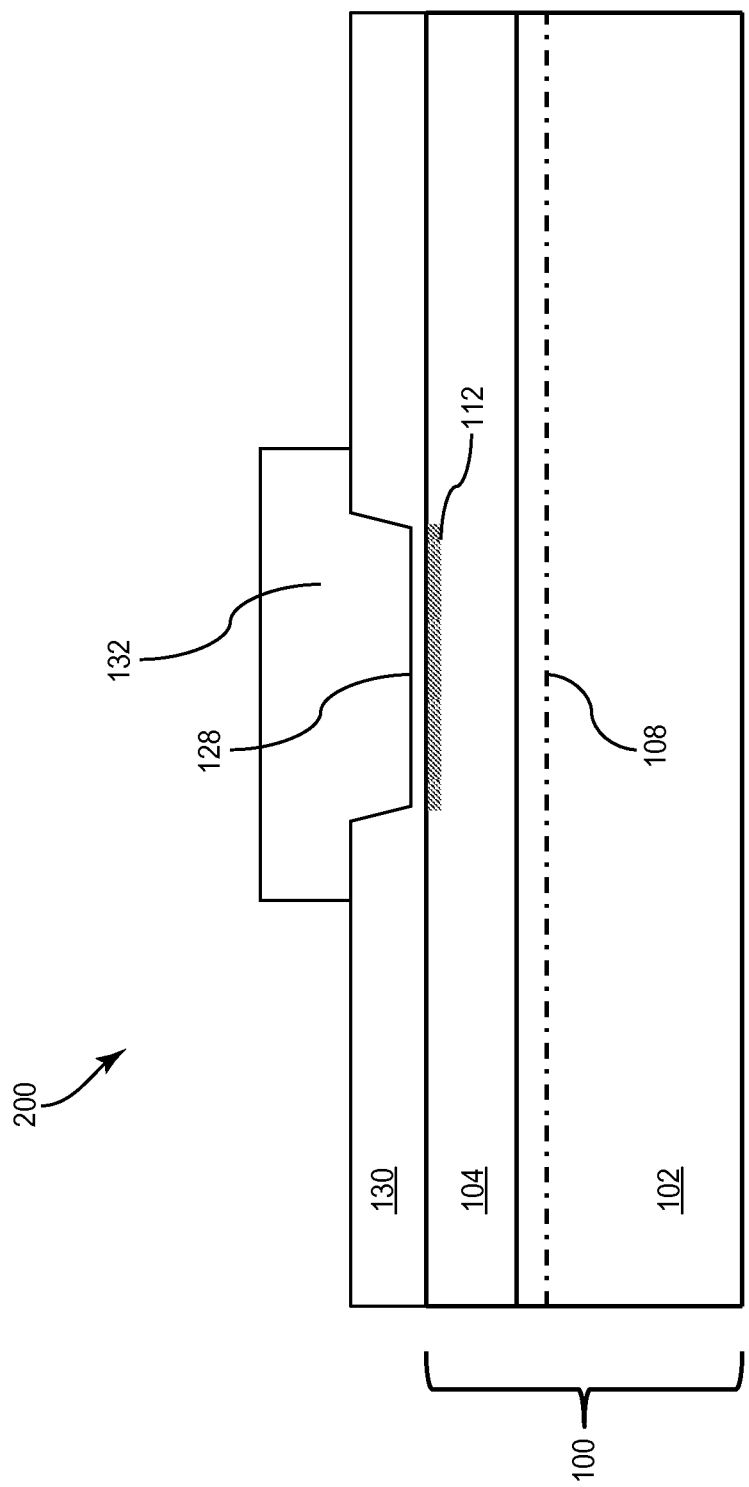
FIG. 8 illustrates a semiconductor device having a fluorine treated dielectric interface, according to an embodiment.

Referring to FIG. 8, a semiconductor device 200 that incorporates the first lateral surface section 112 of the substrate 100 into the structure of the semiconductor device 200 is depicted. More particularly, the semiconductor device 200 is a HEMT MISFET, and the fluorine treated first lateral surface section 112 provides a dielectric interface between the substrate 100 and the gate dielectric 128.

The semiconductor device 200 shown in FIG. 8 may be formed by removing the mask 114 layer after the fluorine treatment, forming a dielectric layer 130 on the substrate 100, and by forming an electrically conductive gate electrode 132 on the dielectric layer 130. Preferably, no ion cleaning processes are applied to the substrate 100 after the fluorine treatment and before the formation of the dielectric layer 130. The ionization effects of such a process can potentially abrogate the beneficial effects of the fluorine treatment described herein. The mask 114 may be removed by a dry etching technique. Further, the dielectric layer 130 may be formed using a direct deposition technique. For example, the dielectric layer 130 may be a silicon nitride (SiN) layer that is formed using a chemical vapor deposition technique, such as low pressure chemical vapor deposition (LPCVD). According to another embodiment, the dielectric layer 130 may be a silicon oxide layer, such as $SiO_2$, using a TEOS-precursor. Any high or low temperature deposition methods, such as chemical vapor deposition (CVD) or atomic layer deposition (ALD) deposition of of SiN, SiOx, AlOx, HfOx or stacked layers may be combined with the fluorine treatment process described herein.

The gate electrode 132 is formed directly above the fluorine treated lateral surface section 112 such that the gate electrode 132 is spaced apart from the channel 108 by the dielectric layer 130, the barrier layer 104 and the buffer layer 102. The gate dielectric 128 portion of the dielectric layer 130 forms an interface with the substrate at the fluorine treated lateral surface section 112. The device 200 is configured is configured to perform a switching operation in a commonly known manner by an appropriate bias to the gate electrode. For example, the gate electrode 132 can be biased to influence a conduction state of the electrically conductive channel 108, which is electrically connected to source and drain electrodes (not shown).

The first lateral surface section 112 is interposed between the gate electrode 132 and the channel 108. That is, the portion of the substrate 100 that has been treated by the fluorine treatment process described herein is arranged directly between the gate electrode 132 and the channel 108. Directly between means that the first lateral surface section 112 overlaps with the gate electrode 132 in a path extending perpendicular to the substrate 100. Therefore, the first lateral surface section 112 occupies a portion of the dielectric interface between the dielectric layer 130 and substrate 100 that is exposed to the electrical fields generated by the gate electrode 132.

Figure 9:
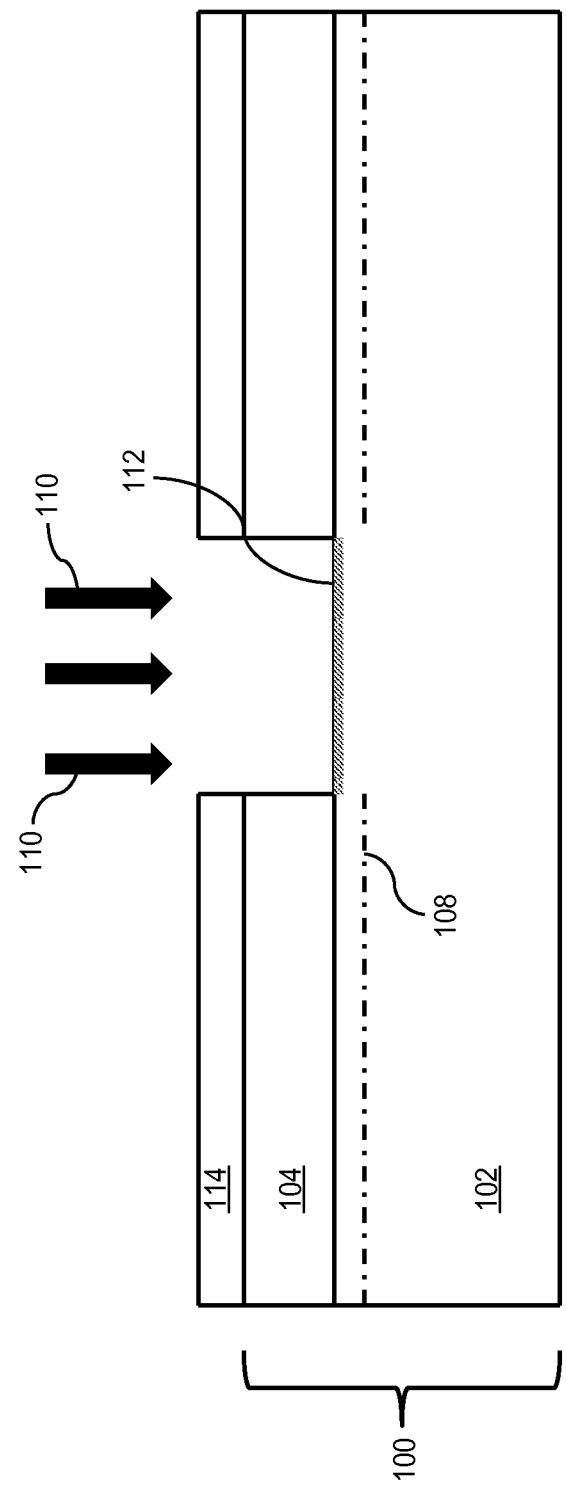
FIG. 9 illustrates a fluorine treatment process applied to a substrate with a section of the buffer layer being exposed to the fluorine containing gas mixture, according to an embodiment.
Figure 10:
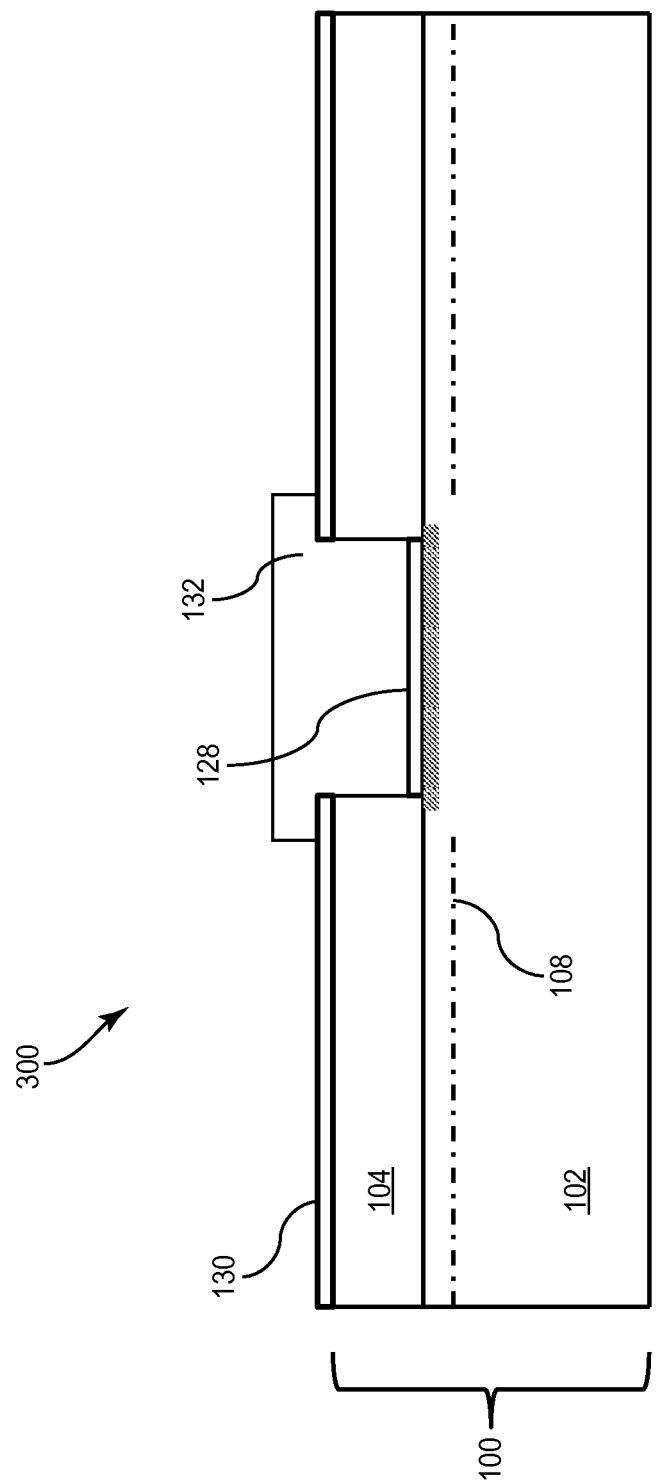
FIG. 10 illustrates a semiconductor device having a fluorine treated dielectric interface, according to another embodiment.

FIGS. 9-10 depict a method of forming a differently configured semiconductor device 300 that utilizes the fluorine treatment process described herein. The device 300 differs from the semiconductor device 200 of FIG. 7 in that the barrier layer 104 is completely removed in the region of the gate electrode 132 such that the gate dielectric 128 is formed directly on the buffer layer 102.

Referring to FIG. 9, a substrate 100 is provided. The substrate 100 includes a buffer layer 102 and barrier layer 104, and may be formed according to the methods described with reference to FIG. 4. Additionally, the substrate 100 has been processed to remove a portion of the barrier layer 104 and to expose a lateral surface section 112 of the buffer layer 102. This may be done by a masked etching technique, for example. Removing the portion of the barrier layer 104 in this manner eliminates the 2DEG in a section of the substrate and therefore provides a normally-off device. The depth of the recess in the substrate may vary. For example, a portion of the buffer layer 102 may be removed simultaneously with the portion of the barrier layer 104 such that the recess in the substrate is deeper than what is shown in FIG. 9.

Optionally, a mask 114 may be provided on the barrier layer 104 so that the fluorination process is only applied to the exposed lateral surface section 112 of the buffer layer 102. According to another embodiment, there is no mask 114 and the fluorine containing gas mixture 110 is therefore applied to both the barrier layer 104 and the exposed lateral surface section 112 of the buffer layer 102. In addition or in the alternative, a passivation layer may be provided on the substrate 100 prior to the fluorine treatment so as to cover a portion of the substrate 100 during the fluorine treatment. Therefore, the free radical state fluorine particles of the fluorine containing gas mixture 110 contact (at least) the exposed lateral section of the buffer layer 102, but do not penetrate the buffer layer 102. The passivation layer may be integrated into the final device structure.

Referring to FIG. 10, a semiconductor device 300 is depicted. The mask 114 has been removed, e.g., by dry etching, and a dielectric layer 130 has been formed along a surface of the substrate 100. These steps may be performed, e.g., in the manner discussed with reference to FIG. 7. The dielectric layer 130 is formed directly on the section of the barrier layer 104 that is treated by the fluorine treatment process. Subsequently, a gate electrode 132 is formed on a gate dielectric 128 section of the dielectric layer 130 directly above first lateral surface section 112 such that the gate electrode 132 is spaced apart from the channel 108 by the gate dielectric 128 and the buffer layer 102. Thus, there are no portions of the barrier layer 104 interposed between the gate electrode 132 and the channel. Further, the fluorine treated first lateral surface section 112 is interposed between the gate electrode 132 and the channel 108. The device configuration of the device 300 may be preferable over the configuration of the device 300 if FIG. 7 for several reasons. One advantage of the device 300 of FIG. 10, e.g., in comparison to the device 200 of FIG. 8, is that the surface mechanisms present at the buffer layer 102 are different than the surface mechanisms present at the barrier layer 104, and may improve the dynamic turn-off behavior of the device.

The impact of the fluorine treatment on the performance of a device, and in particular the influence of the fluorine treatment on the threshold voltage drift and dynamic switching response will now be discussed with reference to FIGS. 11-18.

Figure 11:
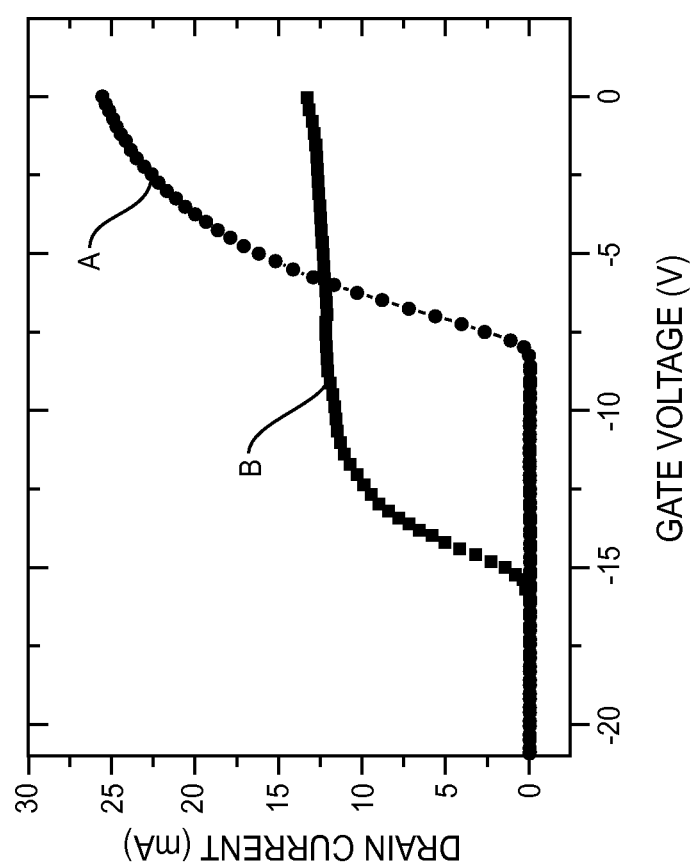
FIG. 11 illustrates a drift/hysteresis comparison between fluorine and non-fluorine treated devices, according to an embodiment.

FIG. 11 depicts a transfer characteristic comparison of two devices. The devices are configured as a MISFET with a GaN/AlGAN substrate, and may be configured in a substantially similar or identical manner to the device 200 discussed with reference to FIG. 8. These transfer characteristics were generated by a standard parameter analyzer. Curve A depicts a transfer characteristic of a device without a fluorine treated dielectric interface. Curve B depicts a transfer characteristic of a device with a dielectric interface that has been fluorine treated according to the methods described herein. As can be seen, the fluorine treatment shifts the threshold voltage of the device by approximately 8 volts (from −7V to about −15V). The degree of shift in the threshold voltage is dependent upon parameters of the fluorine treatment process, such as the composition of the gas mixture and the process time. The threshold voltage shift as shown has been observed in devices having fluorine treatment times as short as 20 seconds. The inventors have further compared these transfer characteristics to a device with a dielectric interface treated by conventional (ion based) fluorination techniques, such as fluorine plasma cleaning and hydrofluoric acid (HF) cleaning, and found that the above depicted transfer characteristic is not realized by the conventional (ion based) fluorination techniques.

The transfer characteristic depicted in FIG. 11 is a long term representation of the device behavior. That is, curves A and B represent the transfer characteristic of a conduction state of the device after a significant enough period has passed (e.g., greater than 1 millisecond) after the switching operation. The inventors have found that the fluorine treated device does not immediately demonstrate this behavior during very short periods of time (e.g., less than 1 millisecond) after the switching operation. FIGS. 12-16 describe this short term drifting effect in greater detail.

Figure 12:
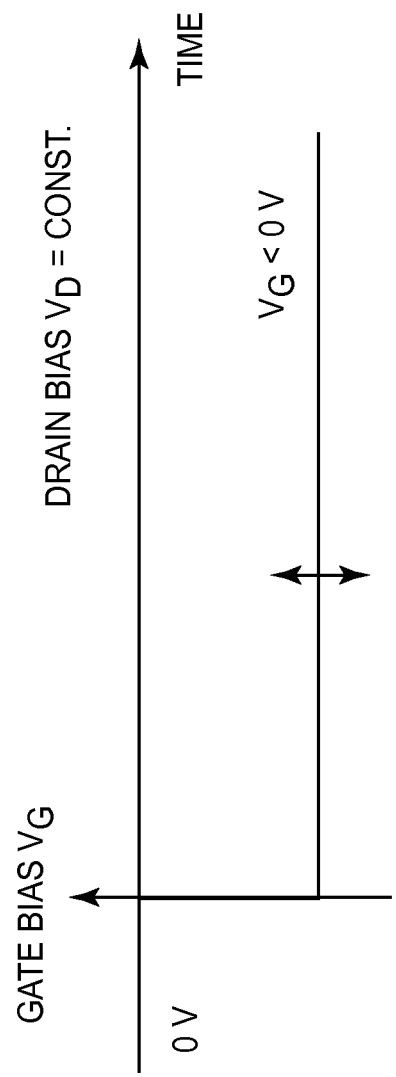
FIG. 12 illustrates a dynamic drain current measurement setup, according to an embodiment.

Referring to FIG. 12, a measurement scheme for the turn9off of a device is depicted. As shown in FIG. 12, initially, the gate bias is stabilized at 0V for a period of time. Subsequently, a gate step bias in the range from 0 to −25 V is applied to the device over a length of time.

Figure 13:
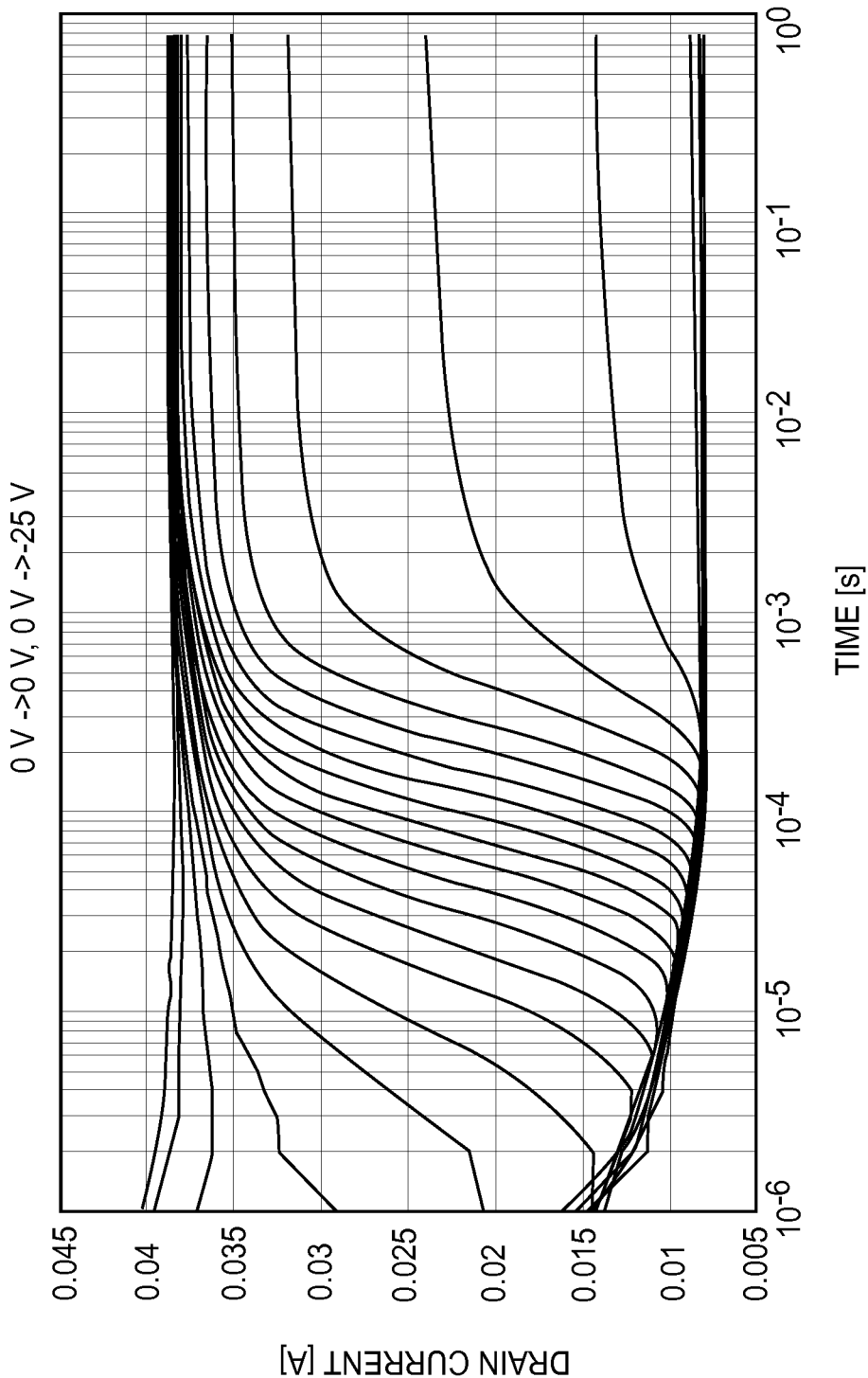
FIG. 13, which includes
Figure 13:
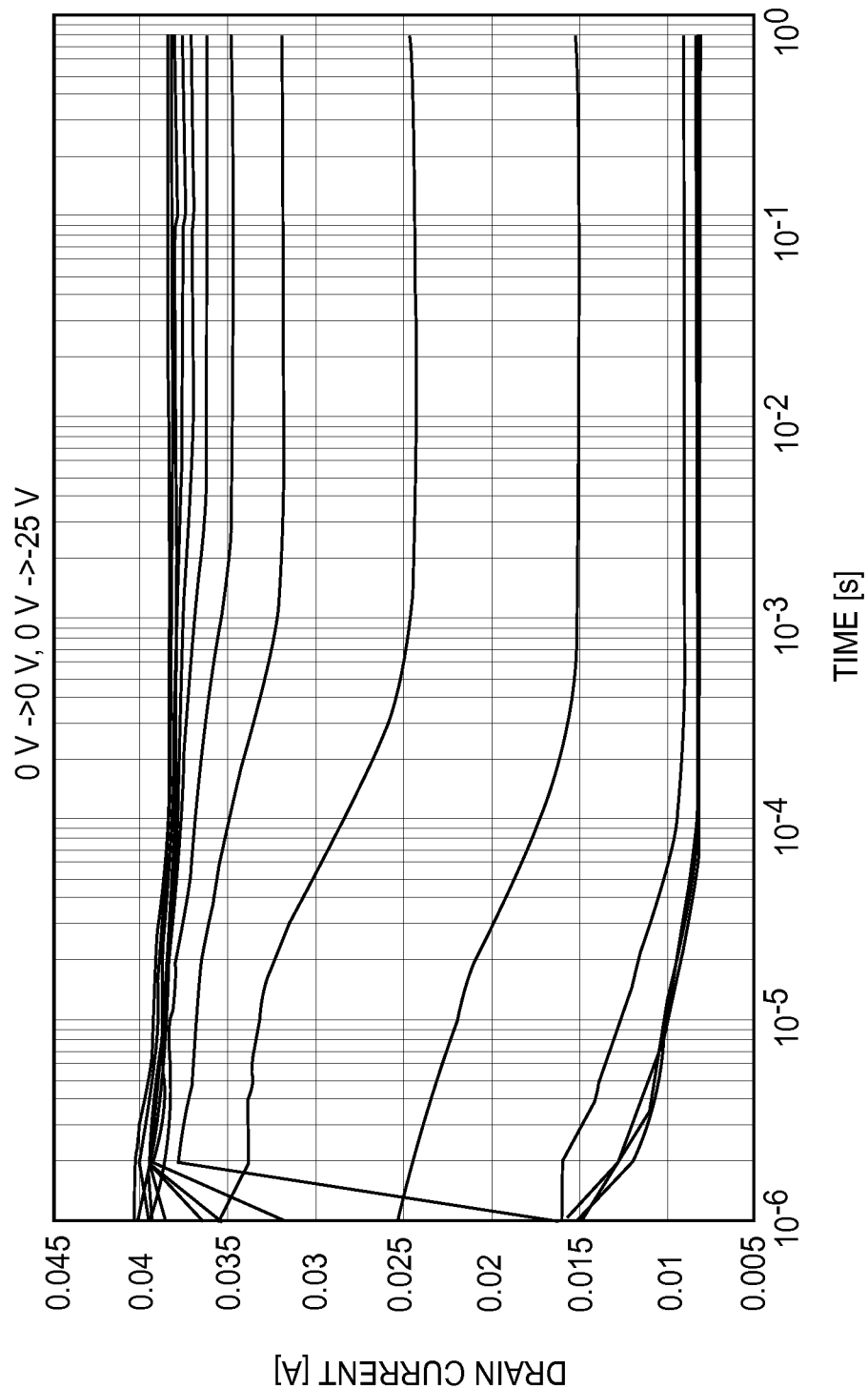

FIG. 13 shows detailed dynamic behavior of the device with varying gate steps performed under the measurement scheme of FIG. 12. FIG. 13A depicts the turn-off behavior of the drain current of the fluorine treated MIS device with the varying gate steps. Each of the lines represents one volt increments of gate step bias. The uppermost curve represents no gate step bias, i.e., $V_G$=0 to $V_G$=0 and the lowermost curve represent a pulse of −25 volts, i.e., $V_G$=0 to $V_G$=−25 volts. When there is no gate step bias, the drain current remains constant in the device. However, with larger pulses, the drain current displays an instantaneous response that differs from the longer term response as shown in FIG. 11. That is, the device does not instantaneously conduct at voltages that should cause conduction. Following the initial depletion of the channel, the 2DEG recovers and reaches back to a full drain current again. This behavior is repeated in similar fashions for all biases until approximately −12V. Then, an actual depletion of the 2DEG can be seen for times greater than 1 ms.

FIG. 13B shows detailed turn-on behavior of the fluorine treated MIS device with varying gate steps. Each of the lines represents one Volt increments of gate step bias. The uppermost curve represents a transition from $V_G$=−25 Volts to $V_G$=−25 Volts and the lowermost curve represents a transition from −25 Volts to $V_G$=−24 Volts. The turn-on behavior in FIG. 13B shows a different characteristic: the device immediately turns on (for all biases larger than the Vth according to FIG. 11). As the Vth moves to the right, the effective overdrive voltage is reduced. After a time span of approximately 1 ms, for turn-off, the drain current is consequently reduced to the thermal equilibrium Vg=0V.

Although the behavior depicted in FIG. 13 is quite different from state-of-the-art GaN MIS devices, it can be explained using the standard model for GaN HEMTs. According to Ibbetson et al. (*Polarization effects, surface states, and the source of electrons in AlGaN/GaN heterostructure field effect transistors*, Applied Physics Letters 77, 250 (2000)), surface donors are responsible for donating electrons to the favorable energetic position at the AlGaN/GaN interface in order to form a 2DEG. These donors are typically not visible in dynamic drift measurements, and consequently the Vth of the device is relatively stable. As the energetic depth of these surface donors is expected to be around 1-2 eV below the conduction band edge of the III-N surface, such deep level defects likely do not play a relevant role during the lifetime of a device. However, if the surface is modified, the position or structure of these defects (cross-section, energy position, etc.) can change and their behavior can be seen under dynamic measurement conditions.

Figure 14:
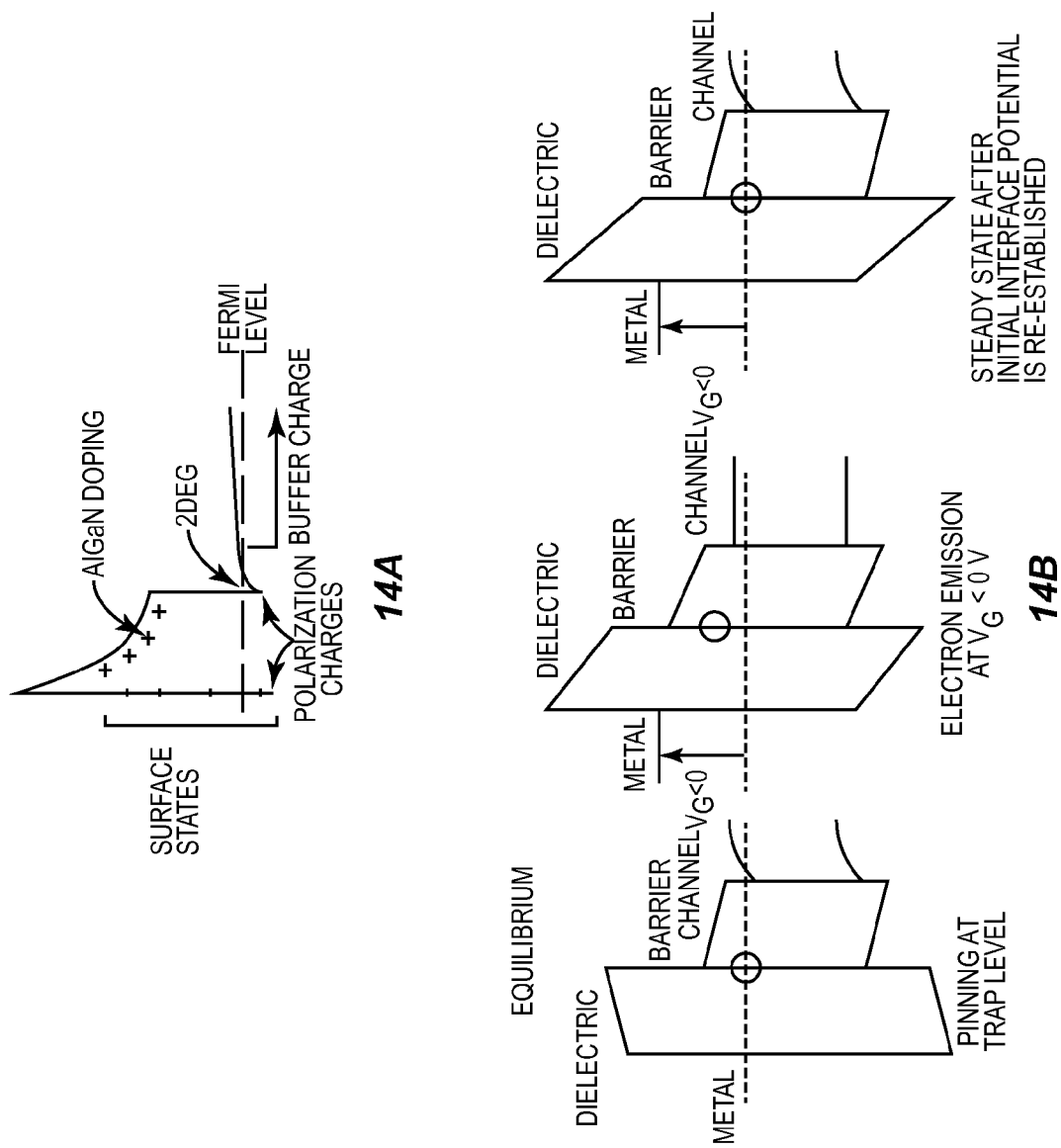
FIG. 14, which includes

FIG. 14 represents the influence of surface donors on the dynamic behavior of a device as described by Ibbetson et al. The leftmost image in FIG. 14B depicts a typical MIS band structure with a large-bandgap dielectric, the AlGaN barrier region and the GaN channel 108 region. The 2DEG, which arises at the interface between the AlGaN barrier and the GaN channel 108, is effectively caused by a dominant donor trap level represented by the semi-blue circle, which pins the interface potential to the Fermi level. If a negative bias is applied to the gate structure, the electrical field in all layers increases, and the 2DEG concentration decreases and may completely disappear. The center image in FIG. 14B depicts the state of the device at the instant the negative bias is applied. As can be seen, the dominant donor trap level does not immediately replace the 2DEG. The rightmost image in FIG. 14B depicts the state of the device at the after negative bias has been applied over a period of time and the device reaches a steady state. After sufficient time has passed to release the electrons from the donor level, the 2DEG channel 108 is refilled again with electrons, which reduces the electric field in the barrier, and increases the electric field in the dielectric. The 2DEG therefore recovers after a short interruption in time, until there are no more donor states left to be ionized/emptied. For a sufficiently low gate bias (i.e., below the static Vth) the device cannot turn itself on anymore.

Figure 15:
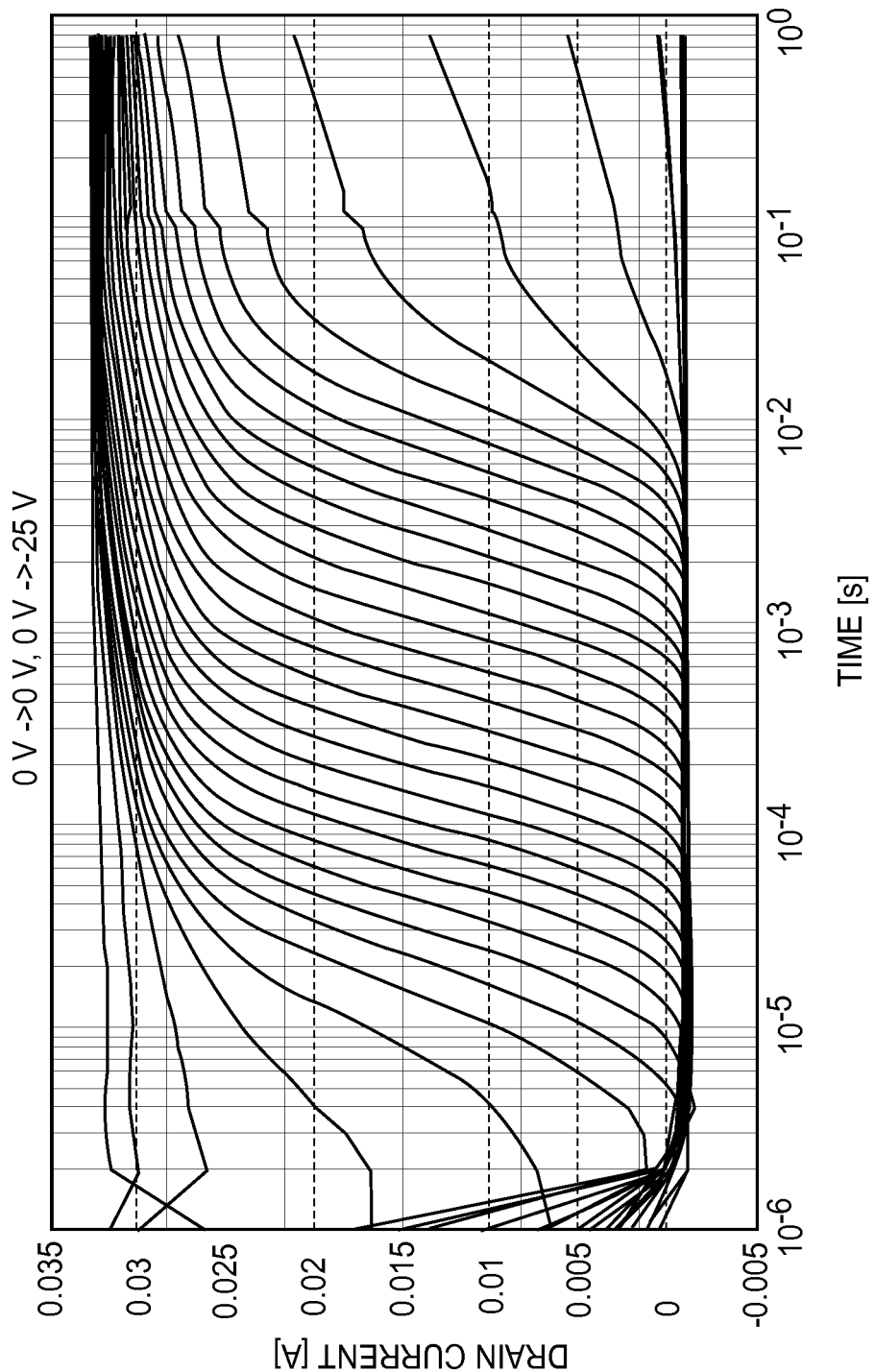
FIG. 15 illustrates a dynamic turn-off characteristic of a fluorine treated MISFET HEMT after the device has be stabilized, according to an embodiment.

So far, the behavior of the device has only been discussed for depletion from Vg=0V to the threshold voltage of the device. FIG. 15 depicts a turn-off characteristic analogous to FIG. 13A, with the only difference being that the device has been (hold bias) stabilized for 1 s at Vg=15 V. Subsequently, voltage pulses in the range of 15V to −25V in increments of 1V are applied to the device. As can be seen, the turn-off behavior starts immediately for voltages below 15V down to the same static threshold voltage. This behavior is shown in more detail in FIG. 16, which plots the dynamic transfer characteristics analogous to FIG. 11 for each decade of time. Each figure uses a different hold bias Vg (15 V, 10V, 5V, 0V, −5V and −10V). The drain current ($I_d$) value response after a certain time is plotted for the different hold biases. The rightmost curves represent the device behavior at a very short (10 μs after switch-off) transient response of the device. The leftmost curves represent the static response (1 second after switch-off) of the device. The device turns off always right below the hold bias for the 10 μs transient response. Then it moves to the left until it reaches the static characteristic.

Figure 16:
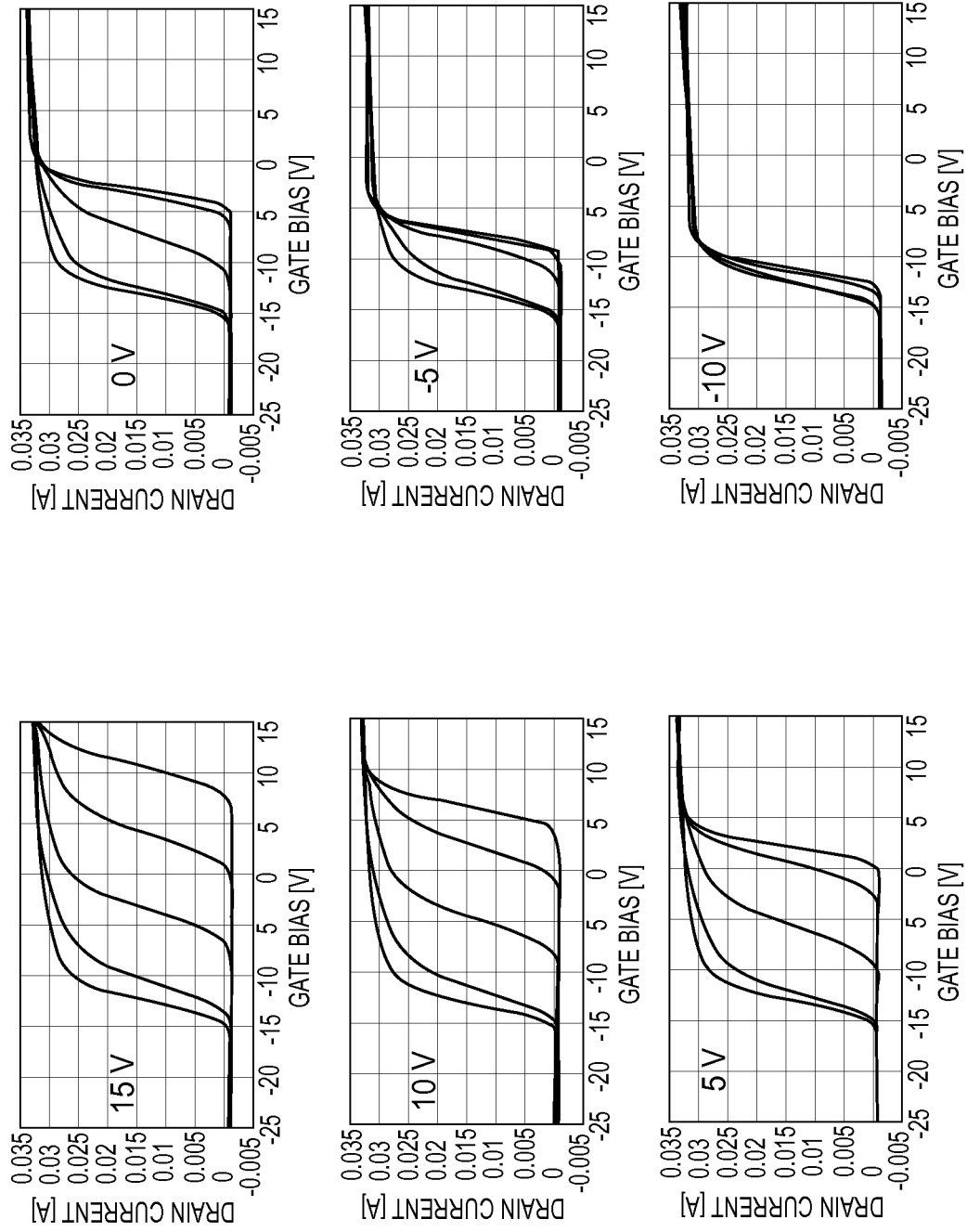
FIG. 16 illustrates dynamic transfer characteristics of a fluorine treated MISFET HEMT extracted from the turn-off behavior for varying transient times and different hold biases at which the device is stabilized before a turn-off bias is applied according to an embodiment.

The consequence of the data depicted in FIGS. 15-16 is that, across the entire bias range that is applied to the gate structure, the dominant surface donors dictate the behavior of the device and no other surface defects are playing a role. Although every GaN HEMT known up to this date is driven by a certain kind of surface donor that is responsible for its 2DEG formation, the dynamic behavior shown above is not observed in devices that are not treated by the fluorine treatment process described herein.

Figure 1:
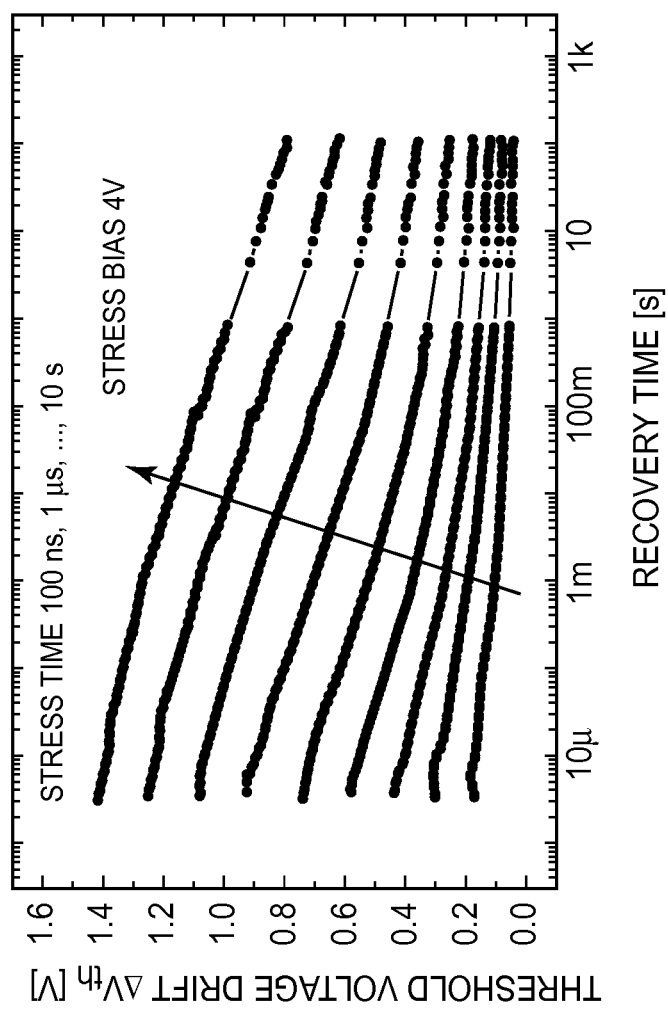
FIG. 1 depicts the change in threshold voltage in a MISFET device plotted as a function of recovery time for a fixed stress bias.
Figure 2:
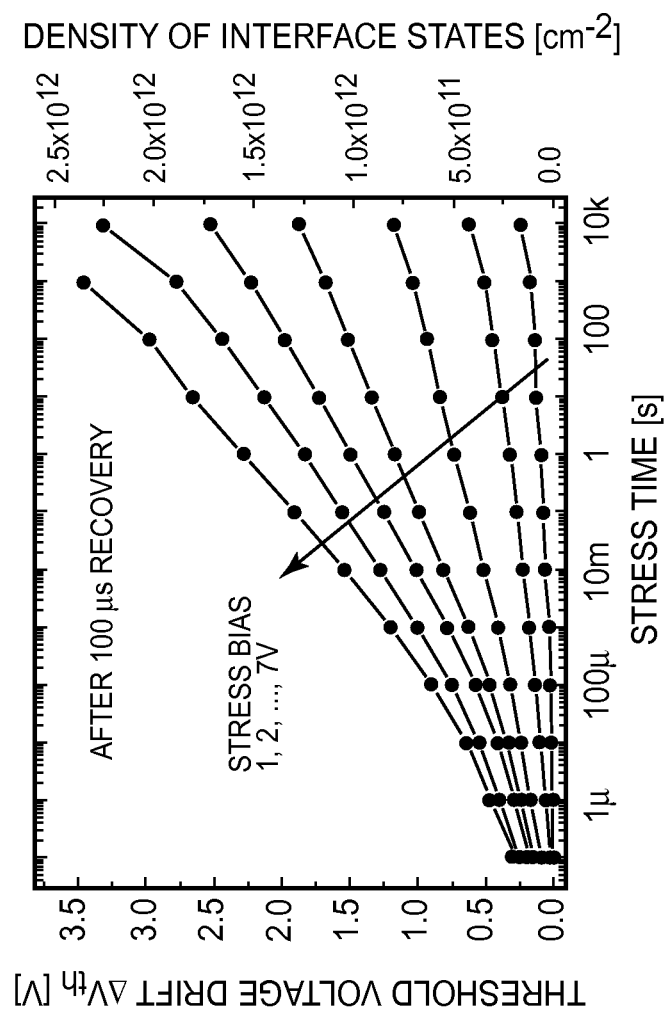
FIG. 2 depicts the change in threshold voltage in a MISFET device plotted as a function of stress time for a certain recovery time.
Figure 3:
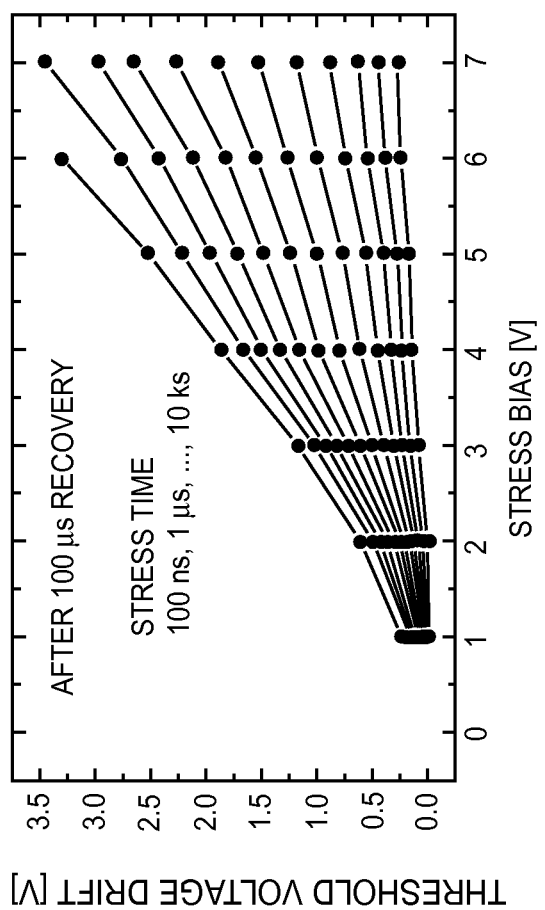
FIG. 3 depicts change in threshold voltage in a MISFET device plotted as a function of stress bias for a certain recovery time.

It was demonstrated in FIGS. 1-3 that all known MISFET dielectrics follow a universal trend with large and very slow recoverable drift behavior that is observed over the entire lifetime of the device. This is now fundamentally changed for the device that has been fluorine treated with free radical fluorine particles according to the methods described herein. This is demonstrated by FIG. 16, which compares the transfer characteristics of two devices. One device has been fluorine treated according to the methods described herein, the other device has not. Curve C represents the transfer characteristic of a device that has not been fluorine treated with no prior stress, and curve D represents the transfer characteristic of a device that has not been fluorine treated after a stress of $V_G$=15V for two seconds. Curve C represents the transfer characteristic of a device that has not been fluorine treated with no prior stress, and curve D represents the transfer characteristic of a device that has not been fluorine treated after a stress of $V_G$=15V for two seconds. Curve E represents the transfer characteristic of a device that has been fluorine treated with no prior stress, and curve F represents the transfer characteristic of a device that has been fluorine treated after a stress of $V_G$=15V for two seconds. In the case of device that has not been fluorine treated, there is a substantial drift in threshold voltage (approx. 5 volts) following the following the log-t capture and emission processes described with reference to FIGS. 1-3. In contrast, the fluorine treated device having a 25 nm SiN gate stack on top of 20 nm AlGaN barrier layer demonstrates essentially no voltage threshold drifting (maximum 500 mV) after a single sweep to 15V and an immediate subsequent measurement. Further, not only has the initial drift behavior changed, but also the long-term stress recovery is fundamentally different and shows a maximum drift behavior that has never appeared with any other dielectric interfaces.

The long term threshold voltage impacts of the fluorine treatment process described herein can be described in terms of an equivalent threshold voltage that is defined by the amount of negative interface charges at an interface between the gate dielectric 128 and the substrate 100. According to an embodiment, an effective threshold voltage shift of the device is less than or equal to $1 \times 10^{12}$ cm$^{-2}$ negative interface charges at an interface between the gate dielectric and the substrate. This threshold voltage shift is maintained at least 10 seconds after a gate bias stress (e.g., as depicted by FIG. 17) equivalent to at least $2.5 \times 10^{13}$ cm$^{-2}$ gate charges for 1000 seconds.

The embodiments described herein include fluorination of III-N surface under a gate dielectric in order to establish a surface modification which creates a dominant surface donor that dominates the fast or slow drift behavior of the device. The device structure can consist of any III-V Nitride material composed of AlGaN, InAlN, InGaAlN, for example, with and without a GaN capping layer or any other capping layer. The gate can be recessed partially into the barrier or even fully through the barrier. Alternatively, the gate contact can be provided on a plane other than the C-plane, as for example in vertical device structures.

Figure 18:
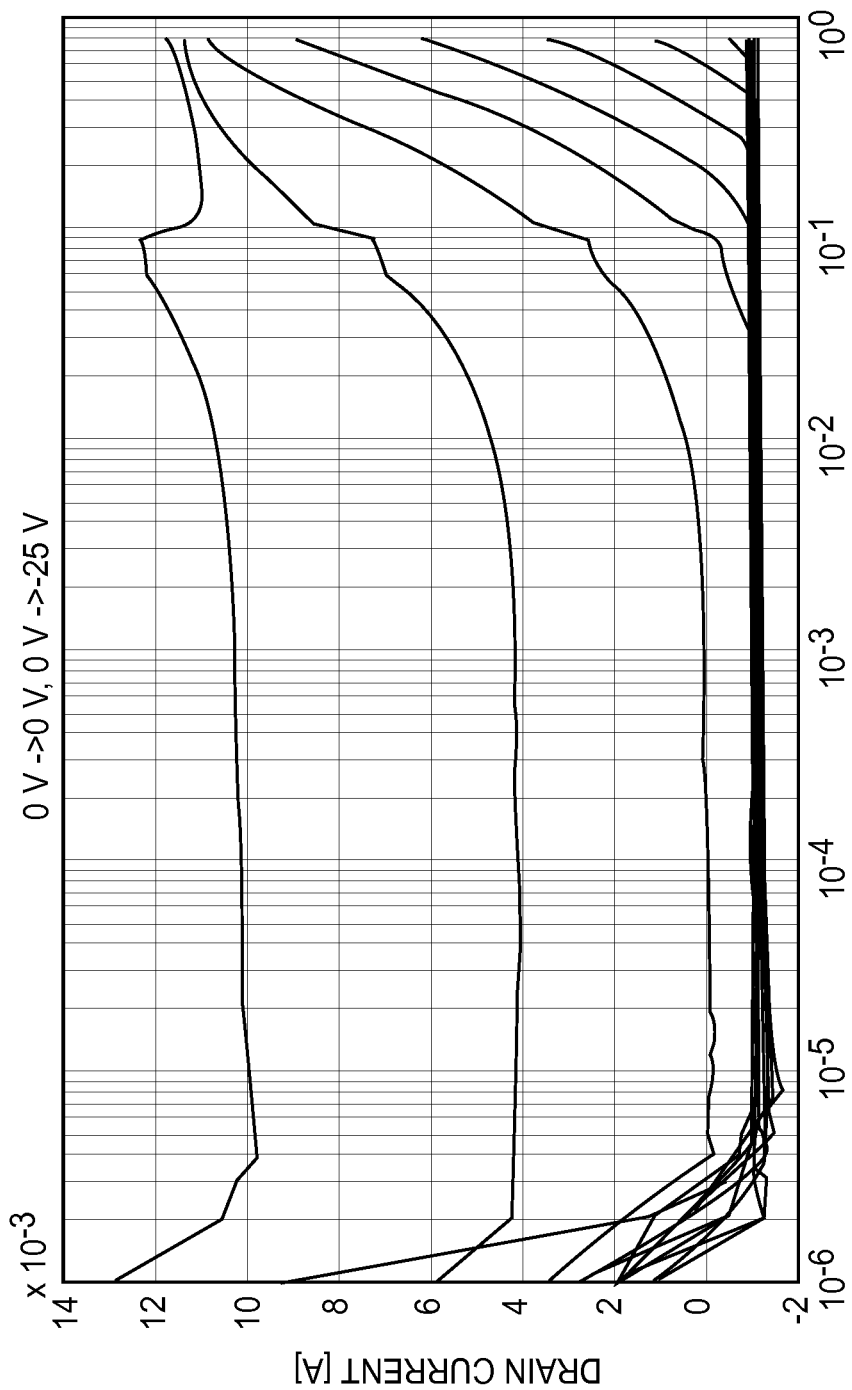
FIG. 18, which includes
Figure 18:
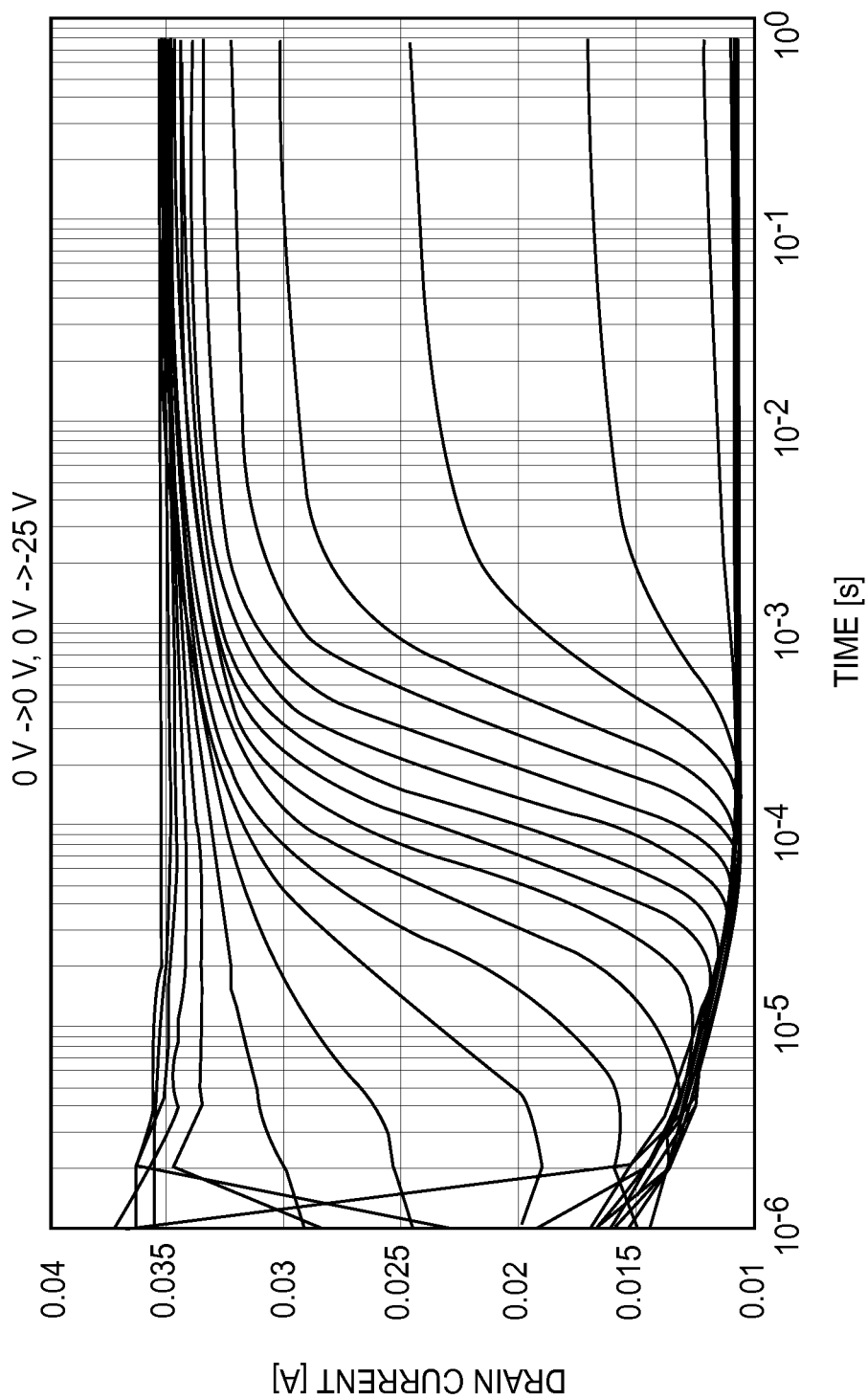

The barrier thickness and Al concentration (or generally the composition of the barrier layer 104) influences the dynamic behavior of the device, as the electrons need to travel from the interface to the 2DEG in order to effectively change the Vth. This relationship is illustrated in FIG. 18. In FIG. 18, the transfer characteristics of devices with two different barrier thicknesses are shown. FIG. 18A depicts the dynamic turn-off response for a device having a 30 nm barrier layer with 10% Al content and FIG. 18B depicts the dynamic turn-off response for a device having a 10 nm thick barrier layer with 40% Al content. It can be seen that for the low Al content and thick barrier (FIG. 18A), the dynamic behavior is much slower, which can be beneficial for the application of such a device. Respectively, a high Al content and thin barrier (FIG. 18B) slightly enhance the dynamic behavior of the device.

Figure 17:
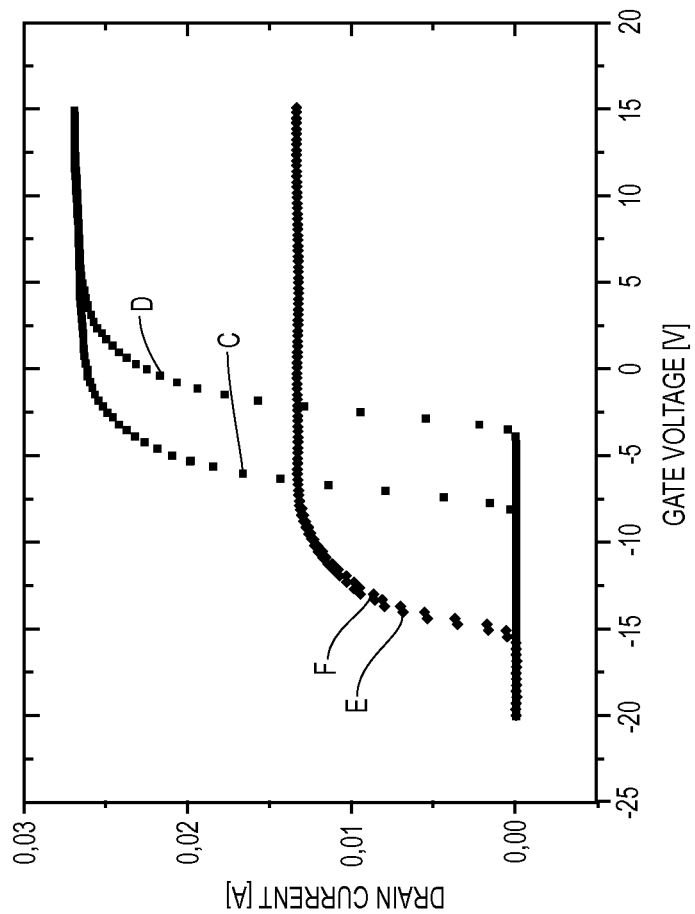
FIG. 17 illustrates a drift/hysteresis comparison between fluorine and non-fluorine treated devices, according to an embodiment.

FIGS. 11 and 17 illustrate the benefits to threshold voltage drift that can be achieved by performing the fluorine treatment process in the manner described herein. These benefits are observed on a longer timescale perspective, e.g., greater than 1 millisecond after switching. In the shorter timescale perspective, e.g., less than or equal to 1 millisecond after switching, the dynamic drift behavior as demonstrated in FIGS. 13, 15 and 16 is observed. One particular advantage of the fluorine treatment process is that the memory effect is substantially eliminated in these devices. That is, there is no cumulative impact on threshold voltage of the device that depends upon prior stress biases and/or stress times, as illustrated in FIGS. 1-3. Further, the shift of threshold voltage occurs in a highly controlled and predictable manner. When weighed against the fact that the short term dynamic drift behavior is highly predictable, and the device recovers from this drifting effect in a very short period of time (e.g., 1 millisecond or less), these long term threshold voltage impacts may provide a favorable tradeoff in many applications. Furthermore, the relationship between barrier thickness and Al concentration as evidenced by FIG. 18 can be utilized in a device configuration to potentially mitigate the short term drifting effects. An example of this is shown by the configuration of the device 300 in FIG. 10. In this device 300, there is no thickness of the barrier layer 104 between the gate electrode 132 and the channel 108. Thus, the short term dynamic drift behavior can be improved and potentially eliminated in such a device.

An additional feature of the fluorine treated devices in comparison to the non-fluorine treated devices is that the drain current capability in the devices may be lowered (see FIGS. 10 and 16). The reason for this behavior arises from the fact that, different to the technique shown in FIGS. 4-9, the fluorine treatment process has been applied to the entire substrate 100, and not just an area directly beneath the gate electrode 132, e.g., as depicted in FIG. 7. Considering the dynamic transfer characteristics from FIG. 15, it can be seen that the actual turn-off behavior of the non-fluorine treated device occurs at a lower Vth than the fluorine treated devices. Thus, the overdrive voltage is smaller and hence the current capability is limited. However, When the fluorine treatment is only used in the gate area (e.g., in the manner described with reference to FIGS. 4-9), the overdrive capability in the access region is not limited anymore. Thus, the device can drive higher currents.

The semiconductor devices 200 and 300 discussed herein provide two examples of devices that utilize a lateral surface section that is treated according to the fluorine treatment process described herein. However, the fluorine treatment process and corresponding benefits from the process (which are attributable to modification of dominant surface donors) can be applied to any number of different semiconductor device structures. For example, a semiconductor device that incorporates the fluorine treated surface section into the structure of the semiconductor device may be a device having a Schottky-barrier gate transistor. The fluorine treatment increases the barrier height between the gate electrode and the substrate. Consequently, the leakage current of the device can be reduced.

The term "substantially" devoid of ionic state fluorine particles as used herein means that the fluorine containing gas mixture 110 has the lowest amount of ionic state fluorine particles that is effectively achievable within tolerances of the fluorination process. For example, in the remote plasma process described herein, while it is possible that a limited number of ionic state fluorine particles generated by plasma may emanate contact the substrate 100, the process is controlled so as to relegate the ionic state fluorine particles (and the recombination thereof) to a location that is remote from the substrate 100 to the fullest extent possible. As a result, a ratio between non-ionized free radical fluorine state particles and ionic state fluorine particles of the fluorine containing gas mixture 110 that contacts the substrate 100 is maximized. Exemplary ratios may be at least 99%, and for example may be higher than 99.9%.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

It is to be understood that the features of the various embodiments described herein may be combined with each other, unless specifically noted otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of forming a III-V semiconductor device, the method comprising:
   forming a substrate comprising a buffer layer and a barrier layer adjoining and extending along the buffer layer, the buffer and barrier layers being formed from first and second semiconductor materials having different bandgaps such that an electrically conductive channel comprising a two-dimensional charge carrier gas arises at an interface between the buffer and barrier layers due to piezoelectric effects;
   applying a fluorine treatment to the substrate, comprising:
   masking the barrier layer prior to applying the fluorine treatment so as to expose a first lateral surface section of the barrier layer o he buffer layer from the mask;
   placing the substrate in a fluorine containing gas mixture, the fluorine containing gas mixture comprising free radical state fluorine particles and being substantially devoid of ionic state fluorine particles;
   exposing the first lateral surface section of the substrate to the fluorine containing gas mixture such that the free radical state fluorine particles contact the first lateral surface section without penetrating the substrate
   removing the mask after the fluorine treatment; and
   forming a semiconductor device in the substrate that incorporates the first lateral surface section into the structure of the semiconductor device.

2. The method of claim 1, wherein applying the fluorine treatment comprises a remote plasma process in which a fluorine containing plasma is generated at a location that is distant to the substrate and the fluorine plasma does not contact the first lateral surface section.

3. The method of claim 2, wherein the fluorine plasma is generated by applying an RF signal to an inductive coil, and wherein the substrate is shielded from the coil.

4. The method of claim 2, wherein the fluorine containing gas mixture is generated by the fluorine plasma, and wherein the substrate is placed outside of a decaying plasma region of the fluorine plasma such that ionic state fluorine particles in the fluorine plasma do not contact the first lateral surface section of the substrate.

5. The method of claim 4, wherein the substrate is separated from the fluorine plasma by a distance of at least ten centimeters during the remote plasma process.

6. The method of claim 2, wherein the remote plasma process comprises:
   providing a treatment tool having first and second chambers that are in open communication with one another;
   placing the substrate in the first chamber with the first lateral surface section being exposed; and
   generating the fluorine containing plasma in the second chamber such that free radical state fluorine particles emanate to the first chamber and ionic state fluorine particles in the fluorine containing plasma remain in the second chamber.

7. The method of claim 6, wherein the fluorine plasma is generated from a fluorine injection gas mixture comprising at least one of: $CF_4$, $C_2F_6$, $C_3F_8$, $C_4F_6$, $SF_6$, $NF_3$, $XeF_2$, $XeF_4$, $XeF_6$, and $F_2$.

8. The method of claim 2, wherein the remote plasma process comprises:
providing a treatment tool comprising a first chamber;
placing the substrate in the first chamber with the first lateral surface section being exposed; and
generating the fluorine containing plasma at a distance from the substrate such that ionic state fluorine particles in the fluorine containing plasma do not contact the substrate.

9. The method of claim 1, wherein the first lateral surface section is a lateral surface section of the barrier layer, and wherein forming the semiconductor device comprises forming a field effect transistor, the method further comprising:
forming a dielectric layer along a surface of the substrate that includes the first lateral surface section; and
forming a gate electrode on the dielectric layer directly above first lateral surface section such that the gate electrode is spaced apart from the channel by the dielectric layer, the barrier layer and the buffer layer, and such that the first lateral surface section is interposed between the gate electrode and the channel.

10. The method of claim 1, wherein the first lateral surface section is a lateral surface section of the buffer layer, and wherein forming the semiconductor device comprises forming a field effect transistor, the method further comprising:
etching a portion of the barrier layer away from the substrate prior to applying the fluorine treatment so as to expose the lateral surface section of the buffer layer;
forming a dielectric layer along a surface of the substrate that includes the first lateral surface section; and
forming a gate electrode on the dielectric layer directly above first lateral surface section such that the gate electrode is spaced apart from the channel by the dielectric layer and the buffer layer, and such that the first lateral surface section is interposed between the gate electrode and the channel.

11. A method of forming a semiconductor device, the method comprising:
forming a substrate comprising a buffer layer and a barrier layer adjoining and extending along the buffer layer, the butler layer being formed from first and second semiconductor materials having different band-gaps such that an electrically conductive channel comprising a two-dimensional charge carrier gas arises at an interface between the buffer and barrier layers due to piezoelectric effects;
applying a fluorine treatment to the substrate, comprising:
exposing a first lateral section of the substrate to a fluorine containing gas mixture so as to influence dominant surface donors at the first lateral section of the substrate and shift a dynamic response of the two-dimensional charge carrier gas under biasing,
wherein the fluorine containing gas mixture is substantially devoid of ionic state fluorine particles and comprises free radical state fluorine particles such that a ratio between the free radical state fluorine particles and the ionic state fluorite particles is at least 99%, and
forming a semiconductor device in the substrate that incorporates the first lateral surface section into the structure of the semiconductor device.

12. The method of claim 11, wherein the free radical state fluorine particles contact the first lateral surface section during the fluorine treatment without penetrating the substrate.

13. The method of claim 11, wherein forming the semiconductor device comprises forming a field effect transistor having a gate electrode that is configured to control a conduction state of the electrically conductive channel and a gate dielectric electrically insulating the gate electrode from the channel, the field effect transistor having an effective threshold voltage shift of less than or equal to $1\times10^{12}$ $cm^{-2}$ negative interface charges at an interface between the gate dielectric and the substrate, and wherein the ratio between free radical state fluorine particles and ionic state fluorine particles is controlled such that the threshold voltage shift is maintained at least 10 seconds after a gate bias stress equivalent to at least $2.5\times10^{13}$ $cm^{-2}$ gate charges for 1000 seconds.

14. The method of claim 11, vherein forming the semiconductor device comprises forming a Schottky-gate transistor.

* * * * *

UNITED STATES PATENT AND TRADEMARK OFFICE
CERTIFICATE OF CORRECTION

PATENT NO. : 9,515,162 B2  
APPLICATION NO. : 14/637610  
DATED : December 6, 2016  
INVENTOR(S) : Reiner et al.

It is certified that error appears in the above-identified patent and that said Letters Patent is hereby corrected as shown below:

In the Claims

Column 14, Line 27 Claim 1, Line 14 change "layer o he" to -- layer or the --

Column 16, Line 17 Claim 11, Line 21 change "99%, and" to -- 99%; and --

Column 16, Line 40 Claim 14, Line 1 change "11, vherein" to -- 11, wherein --

Signed and Sealed this  
Sixth Day of June, 2017

Michelle K. Lee  
*Director of the United States Patent and Trademark Office*